United States Patent
Wang et al.

(10) Patent No.: US 11,915,940 B2
(45) Date of Patent: Feb. 27, 2024

(54) METHOD OF DEPOSITING A PRE-ETCH PROTECTIVE LAYER

(71) Applicant: Applied Materials, Inc., Santa Clara, CA (US)

(72) Inventors: Zhi Gang Wang, Xi'an (CN); Jiao Yang, Xi'an (CN); Alfredo Granados, San Antonio, TX (US); Jon C. Farr, Tempe, AZ (US); Heng Wang, Shaanxi (CN); Rui Zhe Ren, Shaanxi (CN)

(73) Assignee: Applied Materials, Inc., Santa Clara, CA (US)

( * ) Notice: Subject to any disclaimer, the term of this patent is extended or adjusted under 35 U.S.C. 154(b) by 175 days.

(21) Appl. No.: 17/367,038

(22) Filed: Jul. 2, 2021

(65) Prior Publication Data

US 2022/0059359 A1 Feb. 24, 2022

Related U.S. Application Data

(63) Continuation of application No. PCT/CN2020/109777, filed on Aug. 18, 2020.

(51) Int. Cl.
  *H01L 21/3065* (2006.01)
  *C23C 16/52* (2006.01)
  (Continued)

(52) U.S. Cl.
  CPC ........ *H01L 21/30655* (2013.01); *C23C 16/52* (2013.01); *H01L 21/0273* (2013.01);
  (Continued)

(58) Field of Classification Search
  None
  See application file for complete search history.

(56) References Cited

U.S. PATENT DOCUMENTS

| 6,846,746 B2 | 1/2005 | Rattner et al. |
| 9,318,341 B2 | 4/2016 | Chebi et al. |
| (Continued) | | |

FOREIGN PATENT DOCUMENTS

| CN | 101054673 A | 10/2007 |
| CN | 101595551 A | 12/2009 |
| (Continued) | | |

OTHER PUBLICATIONS

International Search Report and Written Opinion for PCT/CN2020/109777 dated Apr. 26, 2021.
(Continued)

*Primary Examiner* — Jiong-Ping Lu
(74) *Attorney, Agent, or Firm* — Patterson + Sheridan, LLP

(57) ABSTRACT

A method of cyclic etching, comprising: (A) depositing, prior to cyclically etching a substrate through a mask opening, a pre-etch protection layer conformally over the mask, sidewalls of the mask defining the mask opening; and an exposed portion of the substrate exposed through the mask opening, the pre-etch protection layer deposited to a first thickness; and (B) cyclically etching the substrate by: (i) depositing a protection layer in the opening of the mask, the protection layer deposited to a second thickness that is less than half of the first thickness; (ii) etching through a portion of the protection layer disposed on the substrate and etching the substrate; and (iii) repeating (i) and (ii) until an end point is reached.

11 Claims, 3 Drawing Sheets

(51) Int. Cl.
*H01L 21/311* (2006.01)
*H01L 21/027* (2006.01)
*H01L 21/033* (2006.01)
*H01L 21/308* (2006.01)
*H01L 21/3213* (2006.01)

(52) U.S. Cl.
CPC ...... *H01L 21/0337* (2013.01); *H01L 21/3086* (2013.01); *H01L 21/31116* (2013.01); *H01L 21/31144* (2013.01); *H01L 21/32139* (2013.01)

(56) References Cited

U.S. PATENT DOCUMENTS

| | | | |
|---|---|---|---|
| 9,543,148 B1* | 1/2017 | Hudson | H01L 21/67069 |
| 2003/0219988 A1* | 11/2003 | Shan | H01L 21/0271 |
| | | | 257/E21.252 |
| 2004/0023508 A1 | 2/2004 | Chinn et al. | |
| 2004/0097077 A1 | 5/2004 | Nallan et al. | |
| 2006/0166107 A1 | 7/2006 | Chen et al. | |
| 2008/0023441 A1* | 1/2008 | Tsai | B81C 1/00571 |
| | | | 216/72 |
| 2009/0163035 A1 | 6/2009 | Romano et al. | |
| 2010/0068885 A1 | 3/2010 | Cirigliano et al. | |
| 2011/0217832 A1 | 9/2011 | Raorane et al. | |
| 2012/0270404 A1 | 10/2012 | Bajaj et al. | |
| 2013/0105947 A1 | 5/2013 | Fuller et al. | |
| 2013/0203256 A1* | 8/2013 | Xu | H01L 21/30655 |
| | | | 438/694 |
| 2017/0178920 A1* | 6/2017 | Dole | H01J 37/32137 |
| 2019/0371617 A1 | 12/2019 | Doh et al. | |

FOREIGN PATENT DOCUMENTS

| | | |
|---|---|---|
| CN | 107369623 A | 11/2017 |
| WO | 2020215183 A1 | 10/2020 |

OTHER PUBLICATIONS

Office Action from Taiwanese Application No. 110126215 dated Jun. 6, 2023.

* cited by examiner

METHOD OF DEPOSITING A PRE-ETCH PROTECTIVE LAYER

CROSS-REFERENCE TO RELATED APPLICATIONS

This application claims benefit of PCT Application Serial No. PCT/CN2020/109777 filed Aug. 18, 2020, which is incorporated by reference in its entirety.

BACKGROUND

Field of Endeavor

Examples described herein generally relate to a method for depositing a protective film on a substrate prior to etching the substrate.

Description of the Related Art

The fabrication of microelectronic devices includes a number of different stages, each stage including a variety of processes. During one stage, a particular process can include imparting a plasma to the surface of a substrate, in order to alter the physical and material properties of the substrate. This process, known as etching, involves the removal of materials to form holes, vias, and/or other openings in the substrate.

Methods for etching high aspect ratio (depth to width) features, such as a trench or hole, often utilize a cyclical process of etching and depositing protective material on a substrate in a single etch reactor. During the etching process, material is deposited on the sidewalls of the trench as the trench is formed. When forming high aspect ratio features such as trenches in the substrate, the roughness of the sidewalls of the trench may render a microelectronic device defective if the sidewall roughness is not properly controlled. A pattern of striations having a series of "peaks" and "valleys" may develop along the sidewalls of the trench. A particular challenge is to control the amount of undercutting below the etch mask, which can result in a very large valley immediately below the mask. Larger peaks and valleys increase the roughness of the sidewalls of the trenches. The frequency and magnitude of the peaks and valleys can compromise the integrity of the microelectronic device, thus shortening the useful life of the microelectronic device.

Accordingly, there is a need in the art for an improved method for etching high aspect ratio features.

SUMMARY

Disclosed herein is a cyclic etch method utilized for forming a high aspect ratio feature in a substrate. In one example, a method of cyclic etching includes depositing, prior to cyclically etching a substrate through a mask opening, a pre-etch protection layer conformally over the mask, and sidewalls of the mask defining the mask opening. The pre-etch protection layer is deposited over an exposed portion of the substrate that is exposed through the mask opening. The pre-etch protection layer is deposited to a first thickness. The method also continues cyclically etching the substrate by: (i) depositing a protection layer in the opening of the mask; and (ii) etching through a portion of the protection layer disposed on the substrate, and etching the substrate. The protection layer is deposited to a second thickness that is less than half of the first thickness. Additionally, the method also continues (iii) repeating (i) and (ii) until an end point is reached.

In another example, a semiconductor processing system is provided. The semiconductor processing system includes an etch chamber, and a non-transitory computer readable medium configured to store instructions. The instructions, when executed by a processor, cause a cyclic etching method to be performed in the etch chamber. The method includes depositing, prior to cyclically etching a substrate through a mask opening, a pre-etch protection layer conformally over the mask, and sidewalls of the mask defining the mask opening. The pre-etch protection layer is deposited over an exposed portion of the substrate that is exposed through the mask opening. The pre-etch protection layer is deposited to a first thickness. The method also continues cyclically etching the substrate by: (i) depositing a protection layer in the opening of the mask; and (ii) etching through a portion of the protection layer disposed on the substrate, and etching the substrate. The protection layer is deposited to a second thickness that is less than half of the first thickness. Additionally, the method also continues (iii) repeating (i) and (ii) until an end point is reached In yet another example, a semiconductor processing system is provided. The semiconductor processing system includes an etch chamber, and a non-transitory computer readable medium configured to store instructions. The instructions, when executed by a processor, cause a cyclic etching method to be performed in the etch chamber. The method includes (A) depositing, prior to cyclically etching a substrate through a mask opening, a pre-etch protection layer conformally over the mask, sidewalls of the mask defining the mask opening. The pre-etch protection layer conformally is formed over an exposed portion of the substrate exposed through the mask opening. The pre-etch protection layer is deposited to a first thickness. A first bias power is applied to the substrate. The method includes (B) cyclically etching the substrate by: (i) depositing a protection layer in the opening of the mask; (ii) etching through a portion of the protection layer disposed on the substrate and etching the substrate; and (iii) applying a second bias power to the substrate. The protection layer is deposited to a second thickness. The first thickness is between about 100 nm and about 300 nm. The second thickness is between about 10 nm to about 30 nm. The first bias power is less than 0.5 W. The second bias power is greater than the first bias. Additionally, the method includes repeating (i), (ii), and (iii) until an end point is reached.

BRIEF DESCRIPTION OF THE DRAWINGS

So that the above recited features of the present disclosure can be understood in detail, a more particular description of the disclosure, briefly summarized above, may be had by reference to examples herein, some of which are illustrated in the appended drawings. However, it is to be noted that the appended drawings illustrate only examples and are therefore not to be considered limiting of the disclosure's scope. Accordingly, the appending drawings admit to other equally effective examples.

In order to facilitate understanding, identical reference numerals have been used, where possible, to designate identical elements that are common features. It is contemplated that elements and features of one example may be beneficially incorporated into other examples without further recitation.

DETAILED DESCRIPTION

Examples disclosed herein are directed to a method etching a high aspect ratio feature, such as a hole or trench, in a substrate. The etching method utilizes a cyclic etch and deposition process. The method disclosed below is illustratively discussed in reference to use in a system configured to etch substrates. Although the method described herein is particularly useful in forming high aspect ratio feature, i.e., features with a depth 10 or more times than a cross sectional profile (such as a width or diameter), the method may alternatively be used in other etch applications.

The high aspect ratio etching method utilizes an initial deposition process followed by cyclic etch and deposition process to form a trench or hole in a substrate. The initial deposition process is different than the deposition process utilized in during the cyclic etch and deposition process. The initial deposition process performed prior to the cyclic etch and deposition process forms a layer of an initial polymer film on a surface of the substrate that is exposed through an opening in the etch mask. The initial polymer film is opened during the etching portion of the cyclic etch and deposition process, exposing a top surface of the substrate through the opening in the etch mask for cyclical etching. A second polymer layer is deposited during the deposition portion of the cyclic etch and deposition process. The second polymer layer covers the sidewalls of the trench and protects the trench against the lateral etching, making the etch process highly anisotropic.

The cyclic etch and deposition process is repeated to incrementally deepen the feature to a desired depth. After etching, the mask is removed by ashing or other suitable method.

The initial polymer layer substantially reduces undercutting of the substrate immediately below the mask. In particular, the initial (e.g., pre-etch) protective layer deposited on top of the substrate prior to the cyclic etch and deposition process not only reduces the undercut of sidewall formed in the substrate, but also additional enables tighter tolerances of critical dimension (CD) to be realized.

Figure 1A:
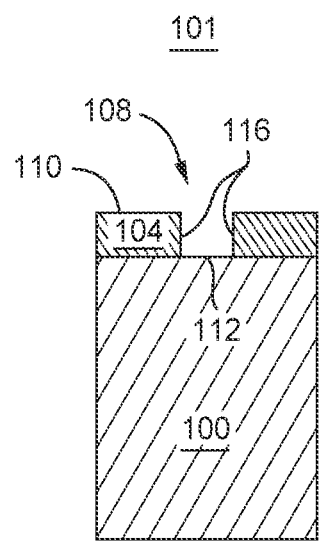
FIGS. 1A through 1E are a schematic sectional view of a substrate during different stages of a high aspect ratio etch process.
Figure 1B:
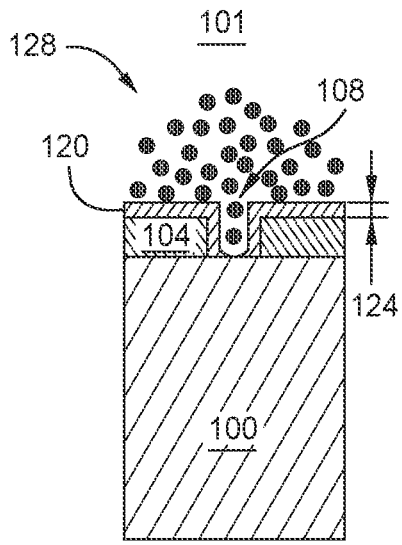
Figure 1C:
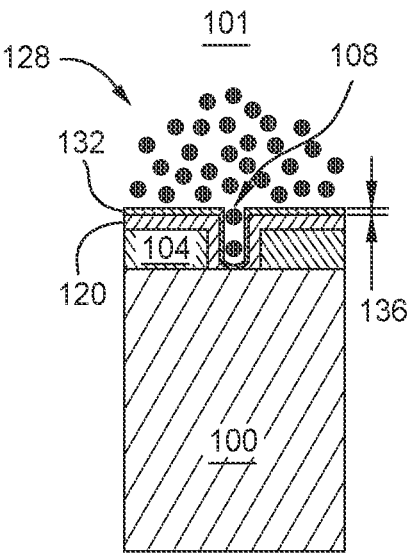
Figure 1D:
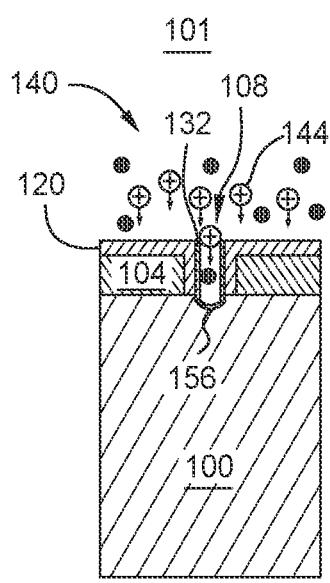
Figure 1E:
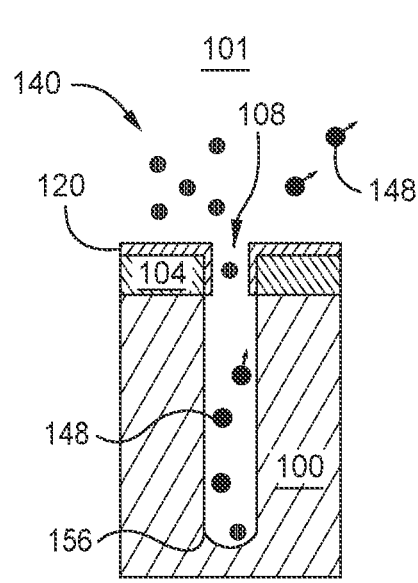
Figure 2:
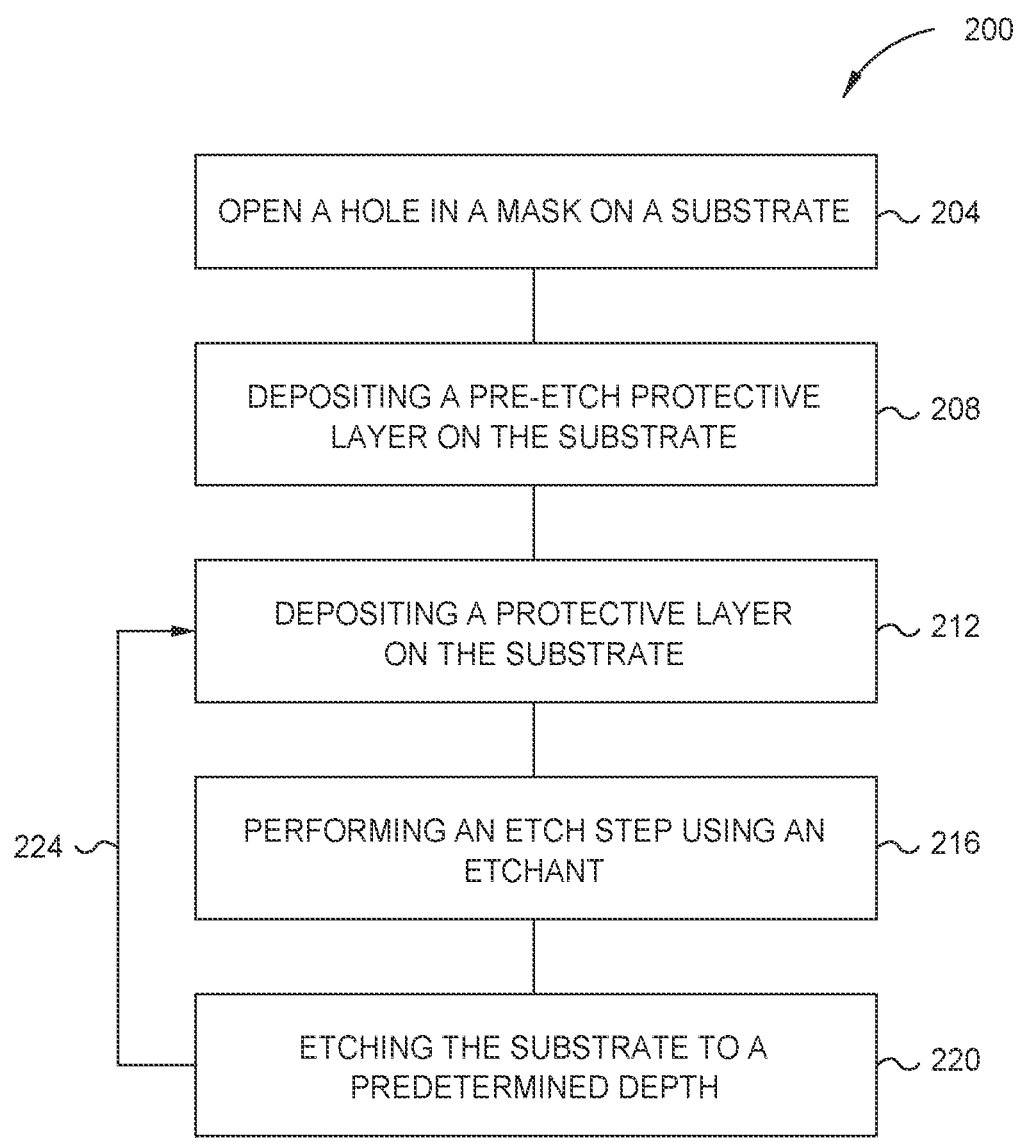
FIG. 2 is a flow diagram of one example of the high aspect ratio etch process corresponding to the sequence shown in FIGS. 1A-1E.

FIG. 2 is a flow diagram of a method 200 for etching a substrate 100 to form a high aspect ratio etch feature, such as a trench, hole and the like. Different stages of the method 200 for etching the substrate 100 are sequentially illustrated in FIGS. 1A-1E.

The method 200 for etching the substrate 100 begins at operation 204 by patterning an etch mask 104 disposed on a substrate 100, as illustrated in FIG. 1A. The mask 104 is patterned to form at least one opening 108. As disclosed above, suitable methods of forming the opening 108 include photolithography, etching, and other known methods. The mask 104 may be formed from a photoresist, a hard mask material or other suitable material.

The substrate 100 and the mask 104 are disposed in an environment 101 in which plasma etching and deposition may be performed. The mask 104 has an opening 108 formed through a top surface 110 of the mask 104. The opening 108 in the mask 104 exposes a top portion 112 of the substrate 100. Additionally, sidewalls 116 of the mask 104 are exposed through the opening 108 in the mask 104. In one example, the substrate 100 is formed from silicon (Si) or a Si containing material. Exemplary silicon containing materials include silicon nitride, or silicon oxynitride. The substrate 100 may alternatively be formed from other materials.

The environment 101 is suitable for processing the substrate 100 with a plasma. The environment 101 can be disposed in a processing chamber (not shown), having sidewalls that enclose the environment 101. The processing chamber may include a source power (not shown), such as an RF source power, and a substrate support (not shown) upon which the substrate 100 may be disposed. The substrate support can have an electrostatic chuck (not shown) used to hold or bias the substrate 100 to the substrate support. Gasses suited to form the plasma are supplied to the environment 101. The gases can be provided by conduits coupled to a gas source(s) and pumps (not shown) that supply pressure to gases provided to the environment 101. Valves are disposed within the conduit to control the flow of gases to the environment 1010. The processing chamber may also include a matching network (not shown) that enables impedance matching between source power and load. Additionally, one or more control systems control the rate of RF power, bias power, gas flow, and plasma formation in the environment 101. Sensors can be disposed in the environment 101, the processing chamber, conduits, pumps, or valves in order to monitor control metrics.

As stated above, the opening 108 in the mask 104 can be formed by methods that include etching, photolithography, or other known techniques. In one example, the mask is a photoresist. The photoresist may be a positive-tone photoresist and/or a negative-tone photoresist, each being capable of undergoing a chemically amplified reaction. The mask 104, in one example, is made of a polymer photoresist material. In one example, the mask 104 is an organic polymer material. Other suitable materials may be used for the mask 104, including other fluorine containing polymers.

At operation 208, a pre-etch protective layer 120 is deposited on the substrate 100 as illustrated in FIG. 1B. The pre-etch protective layer 120 is deposited conformally to the mask 104 and substrate 100, such that the pre-etch protective layer 120 covers a top surface 110, a top portion 112, and sidewalls 116 of the mask 104.

The pre-etch protection layer 120 is deposited to a first thickness 124. The pre-etch protection layer 120 conformally overlays the top surface 110, top portion 112, and sidewalls 116 of the mask 104. The first thickness 124 of pre-etch protection layer 120 is between about 100 nm and about 300 nm, such as about 100 nm. In another example, the first thickness 124 is between about 150 nm and about 200 nm. In another example, the first thickness is between about 175 nm and about 185 nm. The first thickness 124, in yet another example, can be between about 200 nm and 300 nm, such as about 225 nm, or about 250 nm.

A deposition gas 128 is reacted in the environment 101 with the plasma over the mask 104 in order to form the pre-etch protection layer 120. In one example, the deposition gas 128 is a gas containing carbon and fluorine. The carbon and fluorine containing gas may be $C_xF_y$, such as $C_4F_8$, in one example. The deposition gas 128 however, is not limited to $C_4F_8$ and can be other gases that include carbon and fluorine.

During deposition of the pre-etch protection layer 120, a pressure of the environment 101 can be adjusted during the cyclic etch process to further improve the trench profiles.

The deposition gas 128 can be provided into the environment 101 at a rate of between about 35 sccm to about 250 sccm, such as about 50 sccm to about 150 sccm. In one example, the rate of flowing the deposition gas 128 into the environment 101 may be between 65 sccm and about 115 sccm, such as about 75 sccm. In another example, the rate may be about 85 sccm, or about 90 sccm. A pressure of the environment 101 is maintained at about 25 milliTorr (mT) to about 65 mT, for example, about 60 mT. In one example, the pressure is maintained at about 30 mT. The pressure can also be maintained at about 40 mT. In another example, the pressure is maintained at about 45 mT; and in yet another example, the pressure is maintained at about 55 mT.

In one example, RF source power applied to a capacitive plate or inductive coils to energize and disassociate the deposition gas above the substrate 100 at about 100 Watts (W) to about 600 W. For example, the RF source power can be applied between about 150 W and 400 W. In yet another example, the RF source power can be applied between about 250 W and 350 W, such as about 300 W.

An RF bias power can be applied to the substrate 100 through the substrate support upon which the substrate rests in order to promote deposition in a direction normal to the surface of the substrate 100. The RF bias power may be applied in a radio frequency range from about 100 kHz to about 13.56 MHz, from about 100 kHz to about 2 MHz, or from about 400 kHz to about 2 MHz. In one example, the RF bias power provided by a bias source power (not shown) to an electrode of an electrostatic chuck is about 0.5 W to about 200 W. For example, the RF bias power may be between about 25 W to about 150 W, such as about 100 W. In another example, the RF bias power applied is substantially equal to 0 W (i.e., not applied). In another example, the RF bias power may be between about 45 W to about 75 W, such as about 55 W. The RF bias power may be pulsed or applied as continuous duty. A duration of the pulse is about 1.0 second(s) to about 5.0 seconds. In one example, the duration of the pulse is between about 1.0 second to about 3.0 seconds. In one example, the pre-etch protection layer 120 is deposited until at least a thickness of at least about 100 nm is obtained.

The RF bias power applied to the substrate 100 by the bias source power may be pulsed, e.g. repeatedly storing or collecting the energy over a time period and then rapidly releasing the energy over another time period to deliver an increased instantaneous amount of power. The RF source power can be continuously applied while the RF bias power is applied. In particular, the RF bias power may be pulsed using generator pulsing capability set by the control system (not shown) to provide a percentage of time that the power is on, which is referred to as the "duty cycle." In one example, the time on and the time off of a pulsed bias power may be uniform throughout the etching cycles. For example, if the power is on for about 3 msec and off for about 15 msec, then the duty cycle would be about 16.67%. The pulsing frequency in cycles per second or hertz (Hz) is equal to 1.0 divided by the sum of the on and off time periods in seconds. For example, when the bias power is on for about 3 msec and off for about 15 msec, for a total of about 18 msec, then the pulsing frequency in cycles per second is about 55.55 Hz.

After operation 208 deposits the pre-etch protective layer 120 on the substrate 100, as cyclical etch and deposition process is performed, as illustrated in FIGS. 1C-1E. In one example, the cyclical etch and deposition process is performed without deposition of an additional pre-etch protective layer 120 prior to the endpoint of the cyclical etch and deposition process. The cyclical etch and deposition process includes operations 212, 216, 220 and 224.

At operation 212, a protective layer 132 is deposited through the opening 108 formed in the mask 104, as illustrated in FIG. 1C. The protective layer 132 is deposited on top of and in contact with protective layer 120, in the first iteration of the cyclical etch and deposition process. In subsequent iterations of the cyclical etch and deposition process, the protective layer 132 is deposited on top of and in contact with portion of the substrate 100 exposed through the opening 108 in the mask 104.

The protection layer 132 is deposited to a second thickness 136 on the substrate 100 during operation 212. The protective layer 132 has a thickness that is less than the thickness of the pre-etch protective layer 120. In one example, the protective layer 132 has a thickness that is less than half the thickness of the pre-etch protective layer 120. In one example, the second thickness 136 is between about 10 nm and 45 nm, such as about 30 nm. Another example of the second thickness 136 is between about 20 nm to about 25 nm, such as about 20 nm. In yet another example, the second thickness 136 is between about 20 nm and about 30 nm. In yet another example, the second thickness 136 is about 40 nm.

The protection layer 132 is formed from the deposition gas 128. That is in one example, the protection layer 132 is formed from same the deposition gas 128 utilized to form the pre-etch protective layer 120. However, the protection layer 132 is deposited with process parameters that are different from the deposition of the pre-etch protection layer 120. Alternatively, the protection layer 132 and the pre-etch protective layer 120 may be formed from deposition gases having different chemical make-up.

During depositing of the protection layer 132, the pressure of the environment 101 etching may be between about 20 mT and about 75 mT, such as between about 35 mT and about 65 mT. In one example, the pressure is about 45 mT. In another example, the pressure is about 50 mT; and yet in another example, the pressure is about 60 mT. The deposition gas 128 may be supplied to the environment 101 at a rate of between about 75 sccm to about 165 sccm, such as about 115 sccm. In another example, the rate is between about 120 sccm and about 145 sccm, such as about 130 sccm. In yet another example, the rate is about 135 sccm. Exemplary rates include about 85 sccm, about 100 sccm, and about 125 sccm.

The source RF power, applied during deposition of the protection layer 132, is between about 200 W and about 1000 W. RF bias power, applied during deposition of the protection layer 132, is between out 0.1 W and about 100 W, such as about 35 W. In one example, the RF bias power is substantially 0 W. And in yet another example, the RF bias power is between about 10 W and about 25 W, such as about 15 W, or about 20 W.

At operation 212, the protective layer 132 may be deposited utilizing any of the process parameters described above on any variation of the pre-etch protective layer 120. For example, the pre-etch protective layer 120 may have been deposited utilizing any of various the process parameters described above followed by performing any variation of the protective layer 132 deposition at operation 212.

At operation 216, the substrate 100 is etch through the opening 108 in the mask 104, as illustrated in FIG. 1D. The substrate 100 is etched using an etchant 140. The etchant 140 removes portions of the protective layer 132 and the pre-etch protective layer 120 exposed at the bottom of the opening 108, and subsequently etches the now exposed portion of the substrate 100.

During operation 216, the etchant 140 is introduced into the environment 101. Ions 144 are created when the etchant 140 is disassociated within the plasma formed in the environment 101 by the application of RF source power. The Ions 144 are driven toward the substrate 100 and into the opening 108. Ions impact and react with the protection layer 132, removing molecules from the protection layer 132. The ions 144 remove the portion of the protection layer 132 covering the bottom of the opening, exposing the pre-etch protection layer 120. The pre-etch protection layer 120 is subsequently removed by the etchant 140 to expose the substrate through the opening. The exposed portion of the substrate is subsequently etched by the etchant 140.

In one example, the etchant 140 is an oxygen-containing gas, such as $O_2$. Other examples of the oxygen containing gas include $CO_2$, CO, $N_2O$, $NO_2$, $O_3$, and $H_2O$, among others. In another example, the etchant 140 is a gas containing fluorine, such as $SF_6$. Examples of suitable fluorine-containing wet or dry etchants include $NF_3$, $CF_4$, $C_2F$, $C_4F_6$, $C_3F_8$, $C_5F_8$, $CHF_3$, $ClF_3$, $BrF_3$, $IF_3$, $NF_3$ or other suitable gas.

A first etch of the top portion 112 of the substrate 100 may include an isotropic etch in order to remove the pre-etch protection layer 120 and/or the protection layer 132 from the top portion 112 of the substrate 100 through the opening 108. The first etch includes providing a mixture of a fluorine-containing gas and oxygen to the environment 101. The etchant 140 can include a fluorine containing gas, such as $SF_6$. The flow rate of the fluorine containing gas is between about 50 sccm and about 100 sccm, such as about 75 sccm. In one example, the flow rate is between about 55 sccm and about 70 sccm, such as about 65 sccm. The etchant 140 can also include an oxygen containing gas, such as $O_2$. The flow rate of the oxygen containing gas is between about 2 sccm and about 15 sccm, such as about 10 sccm. In another example, the oxygen containing gas is provided to the environment 101 at a rate between about 3.5 sccm and about 7.5 sccm, such as about 5 sccm, or about 5 sccm. The first etch may have a duration of about 0.5 s to about 4 s, such as about 1.0 seconds. In another example, the first etch has a duration between about 1.5 s and of about 2.5 s, such as about 2.0 s. The RF source power is between about 200 W and about 550 W, such as about 250 W, or about 300 W. The RF bias power provided to the substrate 100 is between about 5 W and about 125 W, such as about 85 W. In another example, the RF bias power is between about 25 W and about 75 W, such as about 65 W. In yet another example, the RF bias power is between about 40 W and about 55 W, such as about 45 W. Additional parameters, including but not limited to pressure, can be adjusted according to the disclosure herein.

Subsequent to the first etch, an anisotropic etch of the substrate 100 occurs during a second etch. The second etch, includes providing the etchant 140 of the mixture of fluorine-containing gas, such as $SF_6$ to the environment 101. The flow rate of the fluorine containing gas is between about 50 sccm and about 100 sccm, such as about 75 sccm. In one example, the flow rate is between about 55 sccm and about 70 sccm, such as about 65 sccm. The second etch may have a duration of about 1 second to about 5 seconds, such as about 4 seconds. In another example, the duration of the second etch is about 1.5 seconds to about 3.5 seconds, such as about 2.5 or about 3.0 seconds. The RF source power is between about 200 W and about 550 W, such as about 250 W, or about 300W. The RF bias power provided to the substrate 100 is between about 0 W and about 3 W. In one example, the RF bias power provided to the substrate 100 is substantially 0. In at least one example, the first etch has a longer duration than the second etch. For example, the first etch may be about 0.2 s to about 0.5 s longer than the second etch.

As described above, in one example as the pre-etch protective layer 120 is deposited on the substrate 100, the pressure of the environment 101 is maintained at about 25 milliTorr (mT) to about 65 mT. The RF source power is applied at less than 500 W, such as between about 150 W and 400 W. The RF bias power may be between about 25 W to about 150 W, such as about 100 W. The RF bias power applied is substantially equal to 0 W (i.e., not applied). The duration of the pulse is about 1.0 second(s) to about 5.0 seconds. The deposition gas 128 is provided into the environment 101 at a rate of between about 35 sccm to about 250 sccm, such as about 50 sccm to about 150 sccm.

Etching of the substrate 100 through the opening may occur utilizing any of the process parameters described above on any variation of the etching process described for operation 216. For example, the substrate 100 may have been etched utilizing any of various the process parameters described above after performing any variation of the protective layer 132 deposition at operation 212 and any variation of the deposition of the pre-etch protective layer 120 at operation 208.

At operation 220, a determination is made is an endpoint is reached. The endpoint may be determined by measuring the etched depth, time of etching, number of cycles, or other suitable technique. If a determination is made is an endpoint is reached, the process is completed as the trench or other high aspect ratio feature has been formed to a desired depth, such as shown in FIG. 1E. If a determination is made is the endpoint is not reached, the process proceeds at operation 224 to preform operations 212, 216 and 220 iteratively until the end point is reached. In one example of operation 220, the substrate 100 is etched to a predetermined depth over a predefined period of time.

At operation 224, a new protective layer 132 is formed in a trench 156 (i.e., high aspect ratio feature) being iteratively etched in the substrate 100 by repeating operation 212. For example, the protection layer 132 is deposited in the opening 108 and conforms to the remaining pre-etch protection layer 120 and the sidewalls of the trench 156. At the subsequent operation 216, an additional etch process is performed that removes the portion of protection layer 132 disposed at the bottom of the trench 156 so that additional substrate material may be isotopically etch and the trench 156 iteratively deepened. Operations 212, 216, 220, 224 are cycled until the trench 156 reaches a desired depth by determination of the endpoint at operation 220.

As illustrated in FIG. 1E, the trench 156 formed therethrough after exposure to the etchant 140. Etchant 140 removes the protection layer 132 from the bottom of the trench 156 so that material 148 from the substrate 100 is removed to deepen the trench 156. The pre-etch protection layer 120 remains until the desired depth of the trench 156 is reached, in one example. The pre-etch protection layer 120 may be removed after the desired depth of the trench 156 is reached.

Figure 3:
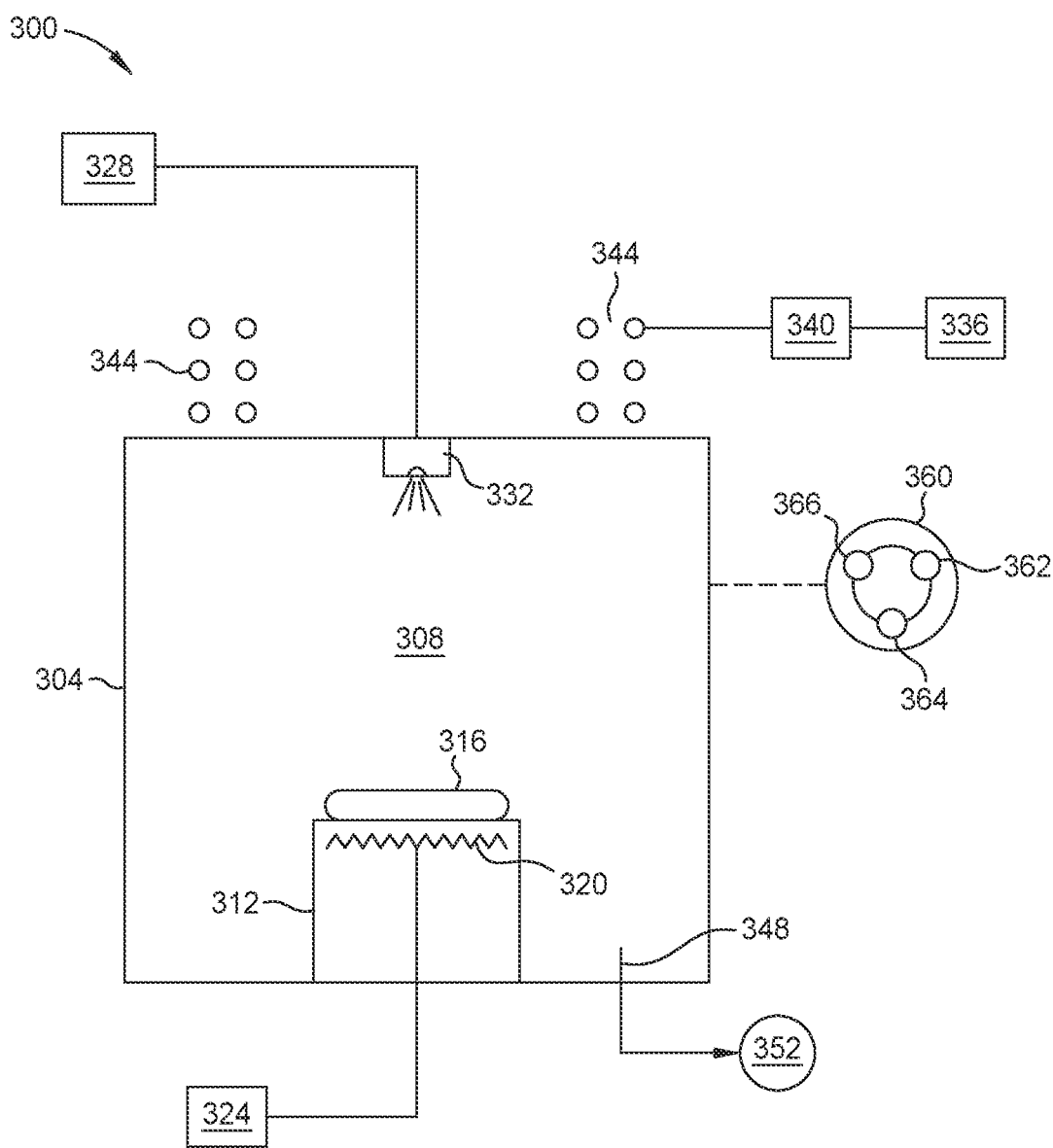
FIG. 3 illustrates a processing chamber in which the method shown in FIG. 2 is performed.

FIG. 3 illustrates a non-limiting example of a processing chamber 300 in which the method 200 shown in FIG. 2 can be performed. The processing chamber 300 includes a chamber body 304 having a plurality of walls that enclose a chamber volume 308. The chamber volume 308 provides the environment 101 in which the method 200 is performed. The processing chamber 300, in one example, is an etch chamber that is configured to etch the substrate 100, as described above. A substrate support 312 configured to support a substrate 100 thereon, is provided within the chamber volume 308. The substrate support 312 has a bias power electrode 320 embedded therein, the bias power electrode 320 coupled to a bias power source 324. As detailed above, the bias power source 324 is configured to supply a bias power to the bias power electrode 320. A gas source 328 is fluidically coupled to a nozzle 332 that is disposed within the chamber volume 308 and attached to the chamber body 304. The gas source 328 is configured to supply one or more of the gasses disclosed above through the nozzle 332 into the chamber volume 308, according to the method 200. A plasma power source 336 is coupled to an inductive plasma power applicator 344 through a matching circuit 340. As described above, the plasma power source 336 applies an RF power to inductive plasma power applicator 344 in order to energize and disassociate the etchant 140 above the substrate 100. An exhaust port 348 is fluidically coupled to a pumping system 352 that removes gasses the chamber volume 308.

A controller 360 is coupled to the processing chamber 300. The controller 360 provides signals to at least one of the bias power electrode 320, the bias power source 324, the gas source 328, the plasma power source 336, the matching circuit 340, inductive plasma power applicator 344, and the pumping system 352. The controller 360 includes a processor 362, a memory 364, and support circuits 366 that are coupled to one another. The processor 362 may be one of any form of general purpose microprocessor, or a general purpose central processing unit (CPU), each of which can be used in an industrial setting, such as a programmable logic controller (PLC), supervisory control and data acquisition (SCADA) systems, or other suitable industrial controller. The memory 364 is non-transitory and may be one or more of readily available memory such as random access memory (RAM), read only memory (ROM), or any other form of digital storage, local or remote. The memory 364 contains instructions, that when executed by the processor 362, facilitates execution of the method 200. The instructions in the memory 364 are in the form of a program product such as a program that implements the method of the present disclosure. The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

Thus, disclosed above is a method for high aspect ratio etching in a substrate utilizing a pre-etch deposition process in conjunction with a cyclic etch and deposition process. Advantageously, the method significantly reduces undercutting of the substrate directly below the etch mask as compared to conventional Bosch processes. While the foregoing is directed to specific examples, other examples may be devised without departing from the basic scope thereof, and the scope thereof is determined by the claims that follow.

What we claim is:

1. A method of cyclic etching, comprising:
   (A) depositing, prior to cyclically etching a substrate through a mask opening, a pre-etch protection layer conformally over the mask, sidewalls of the mask defining the mask opening; and an exposed portion of the substrate exposed through the mask opening, the pre-etch protection layer deposited to a first thickness; and
   (B) cyclically etching the substrate by:
      (i) depositing a protection layer in the opening of the mask, the protection layer deposited to a second thickness that is less than half of the first thickness;
      (ii) etching through a portion of the protection layer disposed on the substrate and etching the substrate wherein the etching comprises exposing the substrate for a first period of time to a plasma formed from a fluorine containing gas and oxygen in presence of a bias power applied to the substrate, and exposing the substrate for a second period of time to a plasma formed essentially from the fluorine contaning gas, wherein the bias power applied during the first period of time is greater than bias power applied during the second period of time; and
      (iii) repeating (i) and (ii) until an end point is reached.

2. The method of claim 1, wherein depositing the pre-etch protection layer further comprises:
   forming the pre-etch protection layer from a carbon-containing gas.

3. The method of claim 2, wherein depositing the protection layer further comprises:
   forming the protection layer from a same carbon-containing gas as the pre-etch protection layer.

4. The method of claim 2, wherein depositing the pre-etch protection layer further comprises:
   applying bias power to the substrate.

5. The method of claim 4, wherein depositing the protection layer further comprises:
   forming the protection layer from a same carbon-containing gas as the pre-etch protection layer without applying bias power to the substrate.

6. The method of claim 5, wherein forming the protection layer from the same carbon-containing gas as the pre-etch protection layer further comprises:
   forming the pre-etch protection layer and the protection layer from $CF_4$.

7. The method of claim 1, wherein depositing the pre-etch protection layer further comprises:
   forming the pre-etch protection layer to a thickness of at least 100 nm.

8. The method of claim 1, wherein depositing the pre-etch protection layer further comprises:
   forming the pre-etch protection layer to a thickness of between about 100 nm and 300 nm.

9. The method of claim 1, wherein depositing the protection layer further comprises:
   forming the protection layer to a thickness of less than about 40 nm.

10. The method of claim 1, wherein exposing the substrate to the plasma during the second period of time further comprises:
    applying a bias power between 0 Watts and 3 Watts to the substrate.

11. The method of claim 1, wherein the substrate is exposed to the plasma during the second period in absence of bias power applied to the substrate.

* * * * *